United States Patent
Tzu et al.

[11] Patent Number: 5,888,678
[45] Date of Patent: Mar. 30, 1999

[54] MASK AND SIMPLIFIED METHOD OF FORMING A MASK INTEGRATING ATTENUATING PHASE SHIFTING MASK PATTERNS AND BINARY MASK PATTERNS ON THE SAME MASK SUBSTRATE

[75] Inventors: San-De Tzu, Taipei; Chia-Hui Lin; Wen-Hong Huang, both of Hsin-Chu; Ching-Chia Lin, Keelung, all of Taiwan

[73] Assignee: Taiwan Semiconductor Manufacturing Company, Ltd., Hsin-Chu, Taiwan

[21] Appl. No.: 20,502

[22] Filed: Feb. 9, 1998

[51] Int. Cl.[6] ....................................... G03F 9/00
[52] U.S. Cl. ................................................ 430/5
[58] Field of Search ............... 430/5, 322, 323, 430/324

[56] References Cited

U.S. PATENT DOCUMENTS

| | | | |
|---|---|---|---|
| 5,326,659 | 7/1994 | Liu et al. | 430/5 |
| 5,429,897 | 7/1995 | Yoshioka et al. | 430/5 |
| 5,468,578 | 11/1995 | Rolfson | 430/5 |
| 5,474,865 | 12/1995 | Vasuder | 430/5 |
| 5,527,645 | 6/1996 | Pati et al. | 430/5 |
| 5,792,578 | 1/1997 | Tzu et al. | 430/5 |

*Primary Examiner*—S. Rosasco
*Attorney, Agent, or Firm*—George O. Saile; Stephen B. Ackerman; Larry J. Prescott

[57] ABSTRACT

A mask and a method of forming a mask having a binary mask pattern in a first region of a transparent mask substrate and a rim type attenuating phase shifting mask pattern in a second region of the same transparent mask substrate. The rim type attenuating phase shifting mask pattern is used to form small contact holes and the binary mask pattern is used to form larger contact holes in an integrated circuit wafer. The use of the rim type attenuating phase shifting mask pattern and the binary mask pattern avoids the problems due to side lobe effect for cases where different size contact holes are required on the same layer in an integrated circuit wafer. The formation of the rim type attenuating phase shifting mask pattern and the binary mask pattern on the same transparent mask substrate increases throughput and decreases cost in the fabrication of integrated circuit wafers.

21 Claims, 4 Drawing Sheets

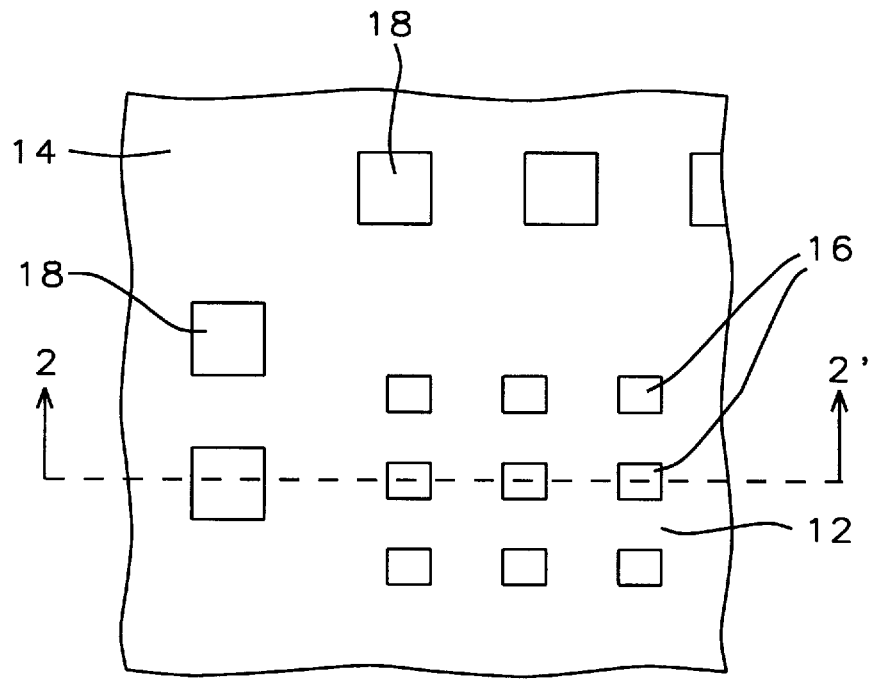
FIG. 1 – Prior Art
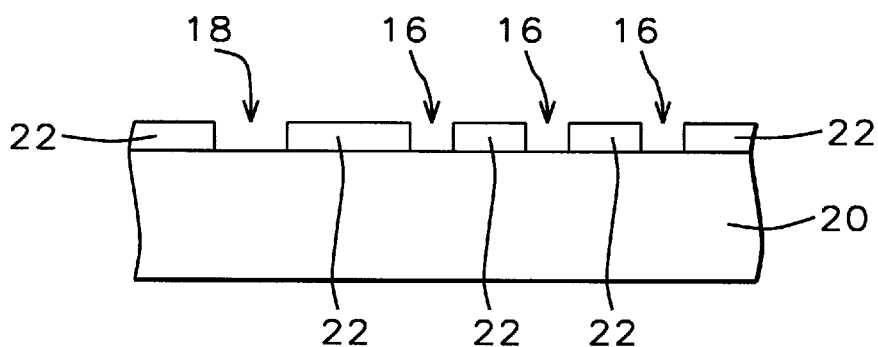
FIG. 2 – Prior Art
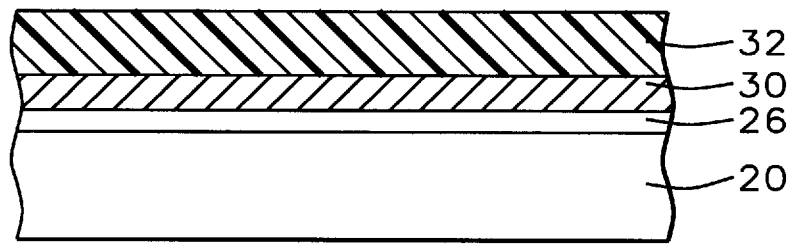
FIG. 3

MASK AND SIMPLIFIED METHOD OF FORMING A MASK INTEGRATING ATTENUATING PHASE SHIFTING MASK PATTERNS AND BINARY MASK PATTERNS ON THE SAME MASK SUBSTRATE

BACKGROUND OF THE INVENTION (1) Field of the Invention

A mask and a method of forming a mask having a binary mask pattern and an attenuating phase shifting mask pattern on the same mask substrate.

(2) Description of the Related Art

Attenuating phase shifting masks are often used to form features such as contact holes in situations where critical dimensions are very small. Problems such as side lobe effect can occur in situations where small contact holes and larger contact holes are required on the same integrated circuit layer. FIG. 1 shows a top view and FIG. 2 a cross section view of a conventional attenuating phase shifting mask having small holes 16 and larger holes 18 on the same mask substrate 20. Since the attenuating phase shifting material 22 attenuates the light but does not block the light totally the intensity required for satisfactory results in the region of the mask having small holes can cause side lobe effect problems, unwanted light at the pattern edges, in the region of the mask having larger holes.

One conventional method of handling the problem of two sizes of contact holes is to use two masks, an attenuating phase shifting mask for the small holes and a binary mask for the larger holes. The two mask method works well but has the problem of reduced throughput and increased cost.

U.S. Pat. No. 5,429,897 to Yoshioka et al. describes the use of an attenuating phase shifting pattern and an attenuating type auxiliary phase shifting pattern to prevent exposure of the region around a normal exposure region.

U.S. Pat. No. 5,527,645 to Pati et al. describes a method of producing phase shifting photolithographic masks. The method includes the steps of defining a binary image pattern to be formed by the illumination system on the image plane, generating a continuous mask function of continuously varying phase which satisfies predetermined error criteria based on the transmission function and the binary image pattern.

U.S. Pat. No. 5,474,865 to Vasudev describes a globally planarized mask using embedded absorbers.

U.S. Pat. No. 5,326,659 to Liu et al. describes a method of forming a mask which compensates for optical diffraction, provides for an extended depth of focus, and allows a shift of the focus plane.

U.S. Pat. No. 5,468,578 to Rolfson describes a method of forming phase shifting masks which avoids the problems of phase conflict areas.

A Patent Application (TSMC-97-201) entitled "A NEW DOUBLE LAYER METHOD FOR FABRICATING A RIM TYPE ATTENUATING PHASE SHIFTING MASK", Ser. No. 08/956,971, filed on Oct. 23, 1997, and assigned to the same assignee describes a method of forming multiple patterns in a single layer of resist. The method uses two different electron beam exposure doses followed by dry anisotropic etching to transfer a pattern from the top part of the resist layer to the bottom part of the resist layer.

This invention relates to an attenuating phase shifting mask and method of forming the mask which can be used to form contact holes of different sizes on the same mask substrate while avoiding the problems of side lobe effect.

SUMMARY OF THE INVENTION

In the manufacture of integrated circuit wafers contact holes are required for providing electrical connections between different levels of electrodes. Phase shifting masks are frequently used to form these contact holes in situations where critical dimensions are increasingly small or where depth of focus is important. Lithographic masks using attenuating phase shifting materials, materials which both attenuate and shift the phase of the incident light, are used in a number of these applications because of the ease of mask design and mask fabrication for these masks.

Although easy mask design and mask fabrication are key advantages for masks using attenuating phase shifting materials they also have problems such as side lobe effect. Side lobe effect occurs because the intensity of the light which passes through the attenuating phase shifting material is not zero and this effect can partially expose the resist at pattern edges. The problem of side lobe effect is even greater in situations where in some regions of a mask very small contact holes are required and in other regions of the mask larger contact holes are required. The light intensity required to produce satisfactory results in the region of the mask with very small contact holes, in this example about 0.3 micrometer, will make the problem of side lobe effect more severe in the region of the mask with larger contact holes, in this example about 0.6 micrometer. This situation can occur in memory products where in the memory cell area of the mask small contact holes are required while in the periphery of the chip around the memory cell area larger contact holes are required.

One method of avoiding the problem of side lobe effect for situations where both small and large contact holes are required is to use two different masks. One mask, a rim type attenuating phase shifting mask, is used to form the small contact holes and to overcome the problem of side lobe effect while retaining the advantages of attenuating phase shifting masks. A second mask, a binary mask, is used to form the larger contact holes where dimensions are such that a phase shifting mask is not required and avoids the problem of side lobe effect. In rim type attenuating phase shifting masks a mask pattern is defined using attenuating phase shifting material. A second pattern of opaque material is then formed over the attenuating phase shifting material leaving a gap width of attenuating phase shifting material which is not covered by the opaque material. The problem of the two mask approach is that two masks are required, production throughput is decreased, an additional pass through the stepper is required, and product cost is increased.

It is a principle objective of this invention to provide a method of forming a mask having both rim type attenuating phase shifting patterns and binary patterns on the same mask substrate.

It is another principle objective of this invention to provide a mask having both rim type attenuating phase shifting patterns and binary patterns on the same mask substrate.

These objectives are achieved by using a mask blank having a layer of attenuating phase shifting material formed on a transparent mask substrate and a layer of opaque material formed on the layer of attenuating phase shifting material. A first pattern is formed in both the layer of attenuating phase shifting material and the layer of opaque material in a first region of the mask which will be used to form the larger contact holes forming a binary type contact hole pattern. A second pattern is formed in both the layer of attenuating phase shifting material and the layer of opaque material in a second region of the mask which will be used to form the small contact holes. A third pattern, wherein that part of the opaque material within an edge width of the pattern edge of the second pattern, is formed in the opaque material in the second region of the mask forming a rim type contact hole pattern. This provides a single mask substrate with both a rim type attenuating phase shifting mask pattern and a binary mask pattern in different regions of the mask.

BRIEF DESCRIPTION OF THE DRAWINGS

FIG. 1 shows top view of a conventional attenuating phase shifting mask for both large and small contact holes.

FIG. 2 shows cross section view of a conventional attenuating phase shifting mask for both large and small contact holes.

FIG. 3 shows a cross section view of a mask blank having a layer of attenuating phase shifting material formed on a transparent mask substrate and a layer of opaque material formed on the layer of attenuating phase shifting material. A layer of resist is formed on the layer of opaque material.

DESCRIPTION OF THE PREFERRED EMBODIMENTS

Refer now to FIGS. 3–10 for a description of the preferred embodiment of a method of forming the combined attenuating phase shifting and binary mask of this invention. FIG. 3 shows a cross section view of the mask blank. The mask blank has a transparent mask substrate 20 with a layer of attenuating phase shifting material 26 formed thereon and a layer of opaque material 30 formed on the layer of attenuating phase shifting material 26. In this example the transparent mask substrate 20 is a material such as quartz having a thickness of between about 0.2 and 0.3 inches, the layer of attenuating phase shifting material 26 is a material such as MoSiON having a thickness of between about 980 and 1380 nanometers, and the layer of opaque material is a layer of chrome having a thickness of 80 and 120 nanometers. A layer of resist 32 is formed on the mask blank. In this example the resist is an E-beam resist having a thickness of between about 400 and 600 nanometers.

Figure 4:
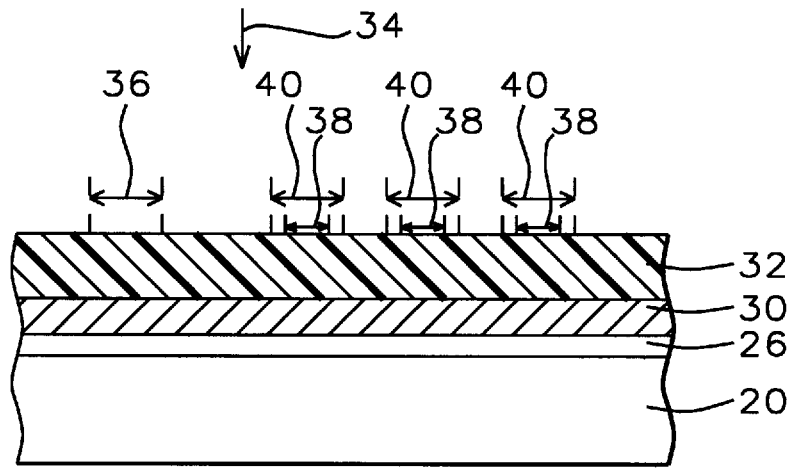
FIG. 4 shows a cross section view of the mask after an electron beam has been used to expose the layer of resist.
Figure 5:
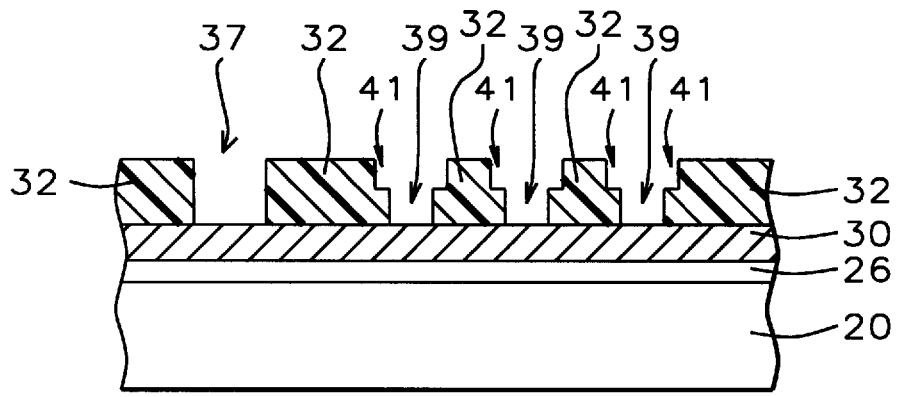
FIG. 5 shows a cross section view of the mask after the layer of resist has been developed and baked.

As shown in FIG. 4, the layer of resist 32 is then exposed using an electron beam 34. The resist is exposed using two electron beam doses. A first pattern is exposed in a first region 36 of the resist and a second pattern is exposed in a second region 38 of the resist using a first electron beam dose which is sufficient to expose the entire thickness of the layer of resist. A third pattern is exposed in a third region of the resist 40 using a second electron beam dose, lower than the first electron beam dose, which is sufficient to expose only the top part of the layer of resist. As shown in FIG. 5, the layer of resist is then developed and baked leaving the first pattern 37 and the second pattern 39 formed in the entire layer of resist and the third pattern 41 formed in only the top part of the layer of resist.

Figure 6:
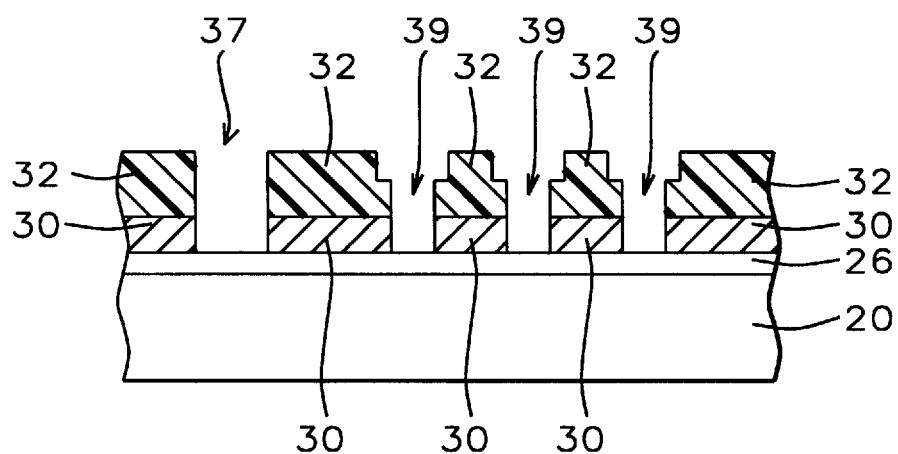
FIG. 6 shows a cross section view of the mask after a pattern has been etched in the layer of opaque material using the pattern in the bottom part of the layer of resist as a mask.
Figure 7:
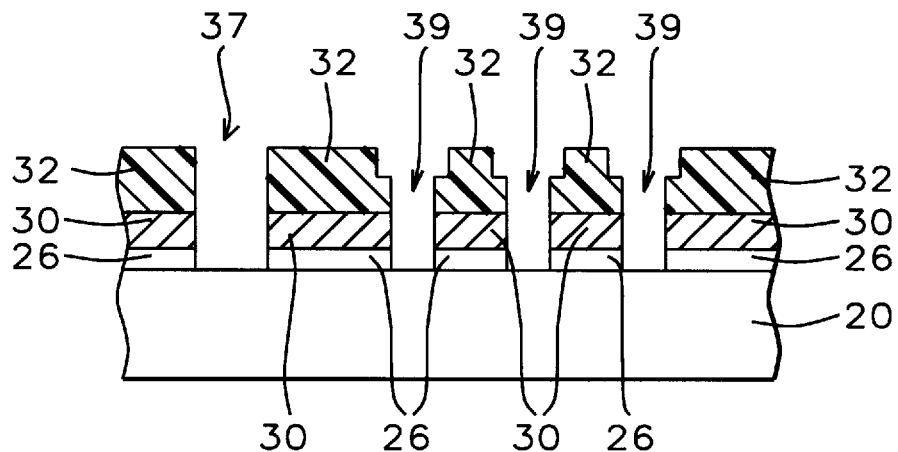
FIG. 7 shows a cross section view of the mask after the pattern has been etched in the layer of attenuating phase shifting material using the pattern in the bottom part of the layer of resist as a mask.

Next, as shown in FIG. 6, the first pattern 37 and the second pattern 39 are etched in the layer of opaque material 30, in this example chrome, using wet isotropic etching with an etchant such as CR-7 ($HClO_4$, $Cl(NH_4)_2(NO_3)_6$). Next, as shown in FIG. 7, the first pattern 37 and the second pattern 39 are etched in the layer of attenuating phase shifting material, in this example MoSiON, using dry anisotropic etching with an etchant such as $CF_4$ and $O_2$.

Figure 8:
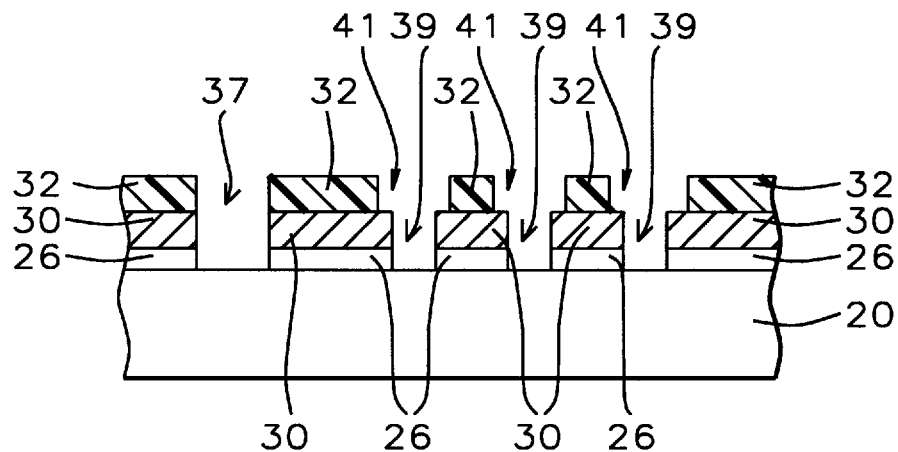
FIG. 8 shows a cross section view of the mask after the pattern in the top part of the layer of resist has been transferred to the bottom part of the layer of resist.

Next, as shown in FIG. 8, the top part of the resist layer 32 is etched away using dry anisotropic etching, in this example $O_2$ plasma dry etching, thereby transferring the third pattern 41 formed in the top part of the layer of resist to the bottom part of the layer of resist.

This method of forming multiple patterns in a single layer of resist by using two different electron beam exposure doses followed by dry anisotropic etching to transfer a pattern from the top part of the resist layer to the bottom part of the resist layer is described in a Patent Application (TSMC-97-201) entitled "A NEW DOUBLE LAYER METHOD FOR FABRICATING A RIM TYPE ATTENUATING PHASE SHIFTING MASK", Ser. No. 08/956,971, Filed on Oct. 23, 1997, and assigned to the same assignee and is incorporated herein by reference.

Figure 9:
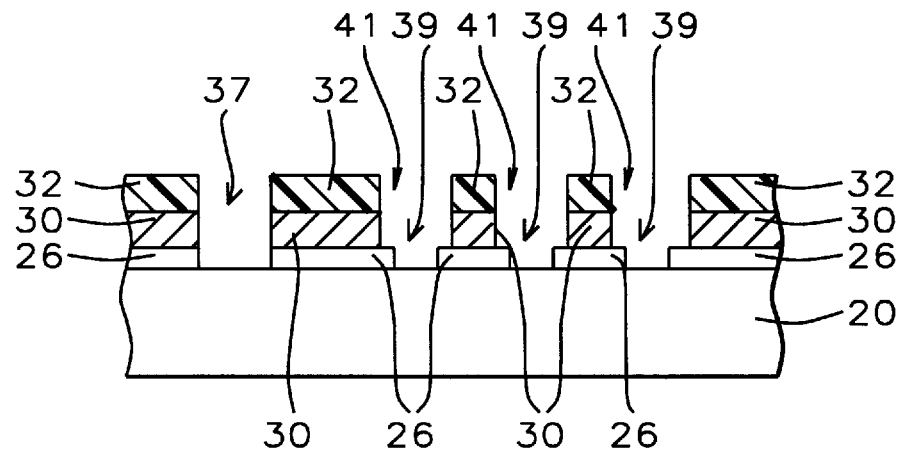
FIG. 9 shows a cross section view of the mask after part of the layer of opaque material has been etched away to form a rim type phase shifting pattern in a region of the mask.

Next, as shown in FIG. 9, the third pattern 41 is etched in the layer of opaque material 30 using dry anisotropic etching with $Cl_2$ and $O_2$ as an etchant. Etching the third pattern 41 in the layer of opaque material removes that part of the opaque layer within an edge distance of the pattern edge of the second pattern 39 and forms a rim type attenuating phase shifting pattern in selected regions of the mask. Next, as shown in FIG. 10, the layer of resist is removed and the mask is completed.

Figure 10:
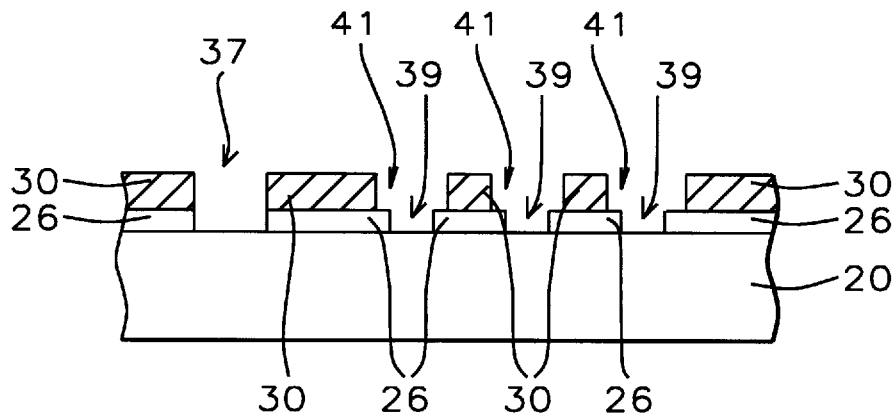
FIG. 10 shows cross section view of the completed mask of this invention having a rim type attenuating phase shifting pattern for small contact holes in one region of the mask and a binary mask pattern for large contact holes in another region of the mask.
Figure 11:
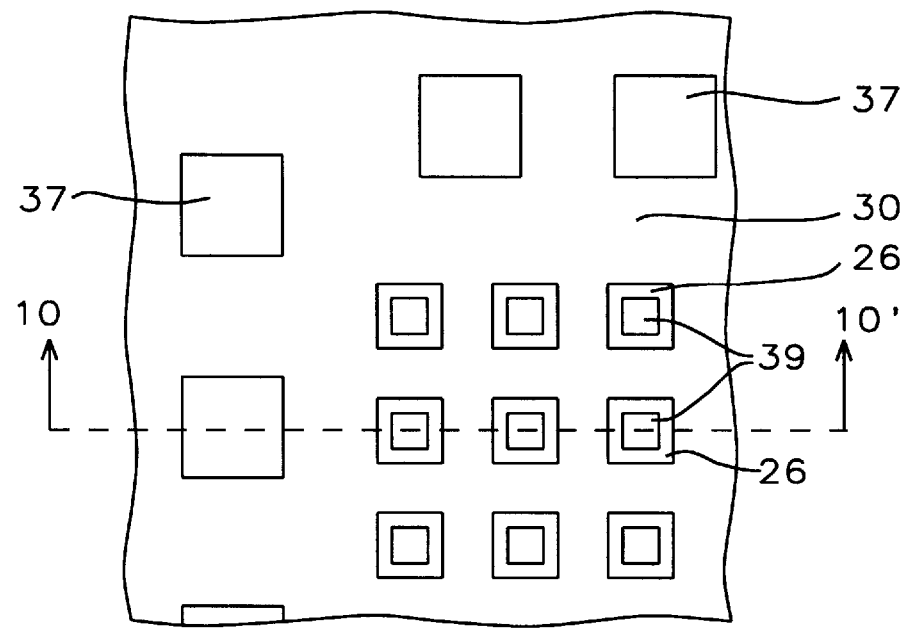
FIG. 11 shows top view of a mask of this invention having a rim type attenuating phase shifting pattern for small contact holes and a binary mask pattern for large contact holes.

The preferred embodiment of the mask of this invention is shown in FIGS. 10 and 11. FIG. 11 shows the top view of the completed mask. FIG. 10 shows a cross section view of the completed mask along line 10–10' of FIG. 11. As can be seen in FIGS. 10 and 11 the first pattern 39 formed in both the opaque layer 30 and the attenuating phase shifting layer 26 forms a binary mask pattern in a first region of the mask. The second pattern 39 formed in the attenuating phase shifting layer 26 and the third pattern 41 formed in the opaque layer 30 form a rim type attenuating phase shifting mask pattern in the second region of the mask. This mask provides a binary mask pattern and a rim type attenuating phase shifting mask pattern on the same transparent mask substrate.

While the invention has been particularly shown and described with reference to the preferred embodiments thereof, it will be understood by those skilled in the art that various changes in form and details may be made without departing from the spirit and scope of the invention.

What is claimed is:

1. A method of forming a mask, comprising the steps of:

providing a transparent mask substrate having a first region and a second region;

forming a layer of attenuating phase shifting material on said transparent mask substrate;

forming a layer of opaque material on said layer of attenuating phase shifting material;

forming a first pattern in said layer of opaque material and said layer of attenuating phase shifting material wherein said first pattern is over said first region of said transparent mask substrate;

forming a second pattern having pattern edges in said layer of opaque material and said layer of attenuating phase shifting material wherein said first pattern is over said second region of said transparent mask substrate; and removing that part of said layer of opaque material within an edge width of said pattern edges of said second pattern formed in said layer of attenuating phase shifting material.

2. The method of claim 1 wherein said layer of attenuating phase shifting material is a layer of MoSiON having a thickness of between about 980 and 1380 nanometers.

3. The method of claim 1 wherein said layer of opaque material is a layer of chrome having a thickness of 80 and 120 nanometers.

4. The method of claim 1 wherein said forming a first pattern and said forming a second pattern having pattern edges in said layer of opaque material and said layer of attenuating phase shifting material comprises wet isotropic etching of said opaque material followed by dry anisotropic etching of said attenuating phase shifting material.

5. The method of claim 1 wherein said removing that part of said layer of opaque material within an edge width of said pattern edges of said first pattern formed in said layer of attenuating phase shifting material uses dry anisotropic etching of said opaque material.

6. The method of claim 1 wherein said transparent mask substrate is quartz having a thickness of between about 0.2 and 0.3 inches.

7. A method of forming a mask, comprising the steps of:

providing a transparent mask substrate having a layer of attenuating phase shifting material formed thereon and a layer of opaque material formed on said layer of attenuating phase shifting material wherein said transparent mask substrate has a first region and a second region;

forming a layer of resist on said layer of opaque material wherein said layer of resist has a top portion having a first thickness and a bottom portion having a second thickness;

forming a first pattern and a second pattern having pattern edges in said top portion and said bottom portion of said layer of resist wherein said first pattern is over said first region of said transparent mask substrate and said second pattern is over said second region of said transparent mask substrate;

forming a third pattern in said top portion of said layer of resist wherein said third pattern is over said second region of said transparent mask substrate;

etching said first pattern and said second pattern in said layer of opaque material using said first pattern and said second pattern formed in said bottom portion of said layer of resist as a mask and a first etching means;

etching said first pattern and said second pattern in said layer of attenuating phase shifting material using said first pattern and said second pattern formed in said bottom portion of said layer of resist as a mask and a second etching means;

etching away said first thickness of said layer of resist using a third etching means thereby forming said third pattern in bottom portion of said layer of resist;

etching said third pattern in said layer of opaque material using said third pattern formed in said bottom portion of said layer of resist as a mask and a fourth etching means thereby removing that part of said layer of opaque material within an edge width of said pattern edges of said second pattern formed in said layer of attenuating phase shifting material; and removing the remaining part of said layer of resist.

8. The method of claim 7 wherein said layer of attenuating phase shifting material is a layer of MoSiON having a thickness of between about 980 and 1380 nanometers.

9. The method of claim 7 wherein said layer of opaque material is a layer of chrome having a thickness of 80 and 120 nanometers.

10. The method of claim 7 wherein said first etching means uses wet isotropic etching with CR-7 ($HClO_4$, $Cl(NH_4)_2(NO_3)_6$) as an etchant.

11. The method of claim 7 wherein said second etching means uses dry anisotropic etching with $CF_4$ and $O_2$ as an etchant.

12. The method of claim 7 wherein said third etching means uses dry anisotropic etching with an $O_2$ plasma as an etchant.

13. The method of claim 7 wherein said fourth etching means uses dry anisotropic etching with $Cl_2$ and $O_2$ as an etchant.

14. The method of claim 7 wherein said transparent mask substrate is quartz having a thickness of between about 0.2 and 0.3 inches.

15. The method of claim 7 wherein the sum of said first thickness and said second thickness is between about 400 and 600 nanometers.

16. The method of claim 7 wherein said forming a first pattern and a second pattern having pattern edges in said top portion and said bottom portion of said layer of resist uses electron beam exposure of said layer of resist using a first exposure dose.

17. The method of claim 7 wherein said forming a third pattern in said top portion of said layer of resist uses electron beam exposure of said layer of resist using a second exposure dose.

18. A mask, comprising:

a transparent mask substrate having a first region and a second region;

a layer of attenuating phase shifting material formed on said transparent mask substrate;

a layer of opaque material formed on said layer of attenuating phase shifting material;

a first pattern formed in said layer of opaque material and said layer of attenuating phase shifting material wherein said first pattern is over said first region of said transparent mask substrate;

a second pattern having pattern edges formed in said layer of opaque material and said layer of attenuating phase shifting material wherein said second pattern is over said second region of said transparent mask substrate; and a third pattern formed in said layer of opaque material wherein that part of said layer of opaque material within an edge width of said pattern edges of said second pattern formed in said layer of attenuating phase shifting material is removed.

19. The mask of claim 18 wherein said layer of attenuating phase shifting material is a layer of MoSiON having a thickness of between about 980 and 1380 nanometers.

20. The mask of claim 18 wherein said layer of opaque material is a layer of chrome having a thickness of 80 and 120 nanometers.

21. The mask of claim 18 wherein said transparent mask substrate is quartz having a thickness of between about 0.2 and 0.3 inches.

* * * * *